US007884635B2

(12) United States Patent
Borot et al.

(10) Patent No.: US 7,884,635 B2
(45) Date of Patent: Feb. 8, 2011

(54) INTEGRATED CIRCUIT, SYSTEM AND METHOD INCLUDING A PERFORMANCE TEST MODE

(75) Inventors: Bertrand Borot, Le Cheylas (FR); Emmanuel Bechet, Grenoble (FR)

(73) Assignee: STMicroelectronics, SA, Montrouge (FR)

( * ) Notice: Subject to any disclaimer, the term of this patent is extended or adjusted under 35 U.S.C. 154(b) by 345 days.

(21) Appl. No.: 12/033,483

(22) Filed: Feb. 19, 2008

(65) Prior Publication Data

US 2008/0197876 A1 Aug. 21, 2008

(30) Foreign Application Priority Data

Feb. 19, 2007 (FR) .................................. 07 53324

(51) Int. Cl.
*H03K 19/00* (2006.01)

(52) U.S. Cl. ........................................................ 326/16

(58) Field of Classification Search ................... 326/16, 326/37–41, 46, 47, 101
See application file for complete search history.

(56) References Cited

U.S. PATENT DOCUMENTS 4,771,251 A 9/1988 Allen et al.
6,437,597 B1 * 8/2002 Chan ........................... 326/16

FOREIGN PATENT DOCUMENTS

EP 1394943 A1 3/2004

OTHER PUBLICATIONS

French Search Report, Application Nos. FA 690243 and FR 0753324, Oct. 16, 2007, 2 pages.
Vermaak, H.J., et al., "Using the Oscillation Test Method to test for Delay Faults in Embedded Cores," AFRICON 2004. 7th AFRICON Conference in Africa. Gaborone, Botswana. Sep. 15-17, 2004. Piscataway, NJ, USA. IEEE. vol. 2, pp. 1105-1110. XP010780588. ISBN: 0-7803-8605-1. Sep. 15, 2004.

* cited by examiner

*Primary Examiner*—Rexford N Barnie
*Assistant Examiner*—Thienvu V Tran
(74) *Attorney, Agent, or Firm*—Lisa K. Jorgenson; Kevin D. Jablonski; Graybeal Jackson LLP

(57) ABSTRACT

An integrated circuit includes N configurable cells each including one functional input, one output, one propagation input and one output. The circuit includes a functional mode in which the N configurable cells are coupled by their functional input and their output to logic blocks with which they cooperate to form at least one logic circuit. The disclosed circuit also includes a test mode in which the N configurable cells are coupled by their propagation input and their output to the logic blocks and in which the output of the Nth configurable cell is coupled to a functional input of the first logic block to form an oscillator.

19 Claims, 1 Drawing Sheet

INTEGRATED CIRCUIT, SYSTEM AND METHOD INCLUDING A PERFORMANCE TEST MODE

PRIORITY CLAIM

The present application claims the benefit of French Patent Application No. 07/53324, filed Feb. 19, 2007, which application is incorporated herein by reference in its entirety.

TECHNICAL FIELD

Embodiments of the invention concern integrated circuits including N configurable cells each including one functional input and one output, each circuit including a functional mode in which the N configurable cells are coupled by their functional input and their output to logic blocks with which they cooperate to form at least one functional circuit.

BACKGROUND

FIG. 1 shows an integrated circuit of this kind. The logic blocks BL1, BL2 are, in practice, logic circuits or portions of logic circuits appropriately constituted by combinatorial logic components associated for the implementation of a particular logic function. In the example shown in FIG. 1, the configurable cells CC1, CC2 are D-latch type flip-flop circuits, including especially a functional D input and a Q output, respectively coupled to an output of a preceding logic block and to an input of a following logic block. The logic blocks BL1, BL2 and the configurable cells work together to form at least one functional circuit. A functional input of the first logic block BL1 forms an input of the integrated circuit to which a data input signal DIN is applied, and the output of the last latch circuit CC2 forms an output of the integrated circuit at which a data output signal DOUT is produced.

The increasing complexity of integrated circuits is being accompanied by a corresponding increase in the number of logic blocks, the complexity of the manufacturing methods and the variability of the performance of integrated circuits coming from a same silicon wafer or from a same batch of wafers.

The insertion of performance testing means into integrated circuits has therefore become a necessity to ensure the performance of the circuits and/or improve the performance of the manufacturing methods.

A testing technique, known as the <<scanpath>> method or <<internal scan method>>, in which the internal paths of an integrated circuit are tested, is used to test the functional blocks of the circuit for accurate functioning. This technique is worthwhile because it uses little surface area of silicon and it can therefore be implanted in finished products. However, this technique does not provide any indication on the performance of the functional blocks, i.e., on the real working speed of the blocks or on the current consumption of the functional blocks.

In another testing technique, test circuits are added on for the testing of the performance of the functional blocks. Test circuits of this kind are typically made out of systems of inverters and the precision of the measurement is at best equal to the delay introduced by an inverter. A test circuit must be used for each logic block to be tested. Furthermore, such test circuits are sensitive to variations in method from one circuit to another. The precision of the measurement and the possibilities of comparison between the circuits are thus limited. Finally, such test circuits are particularly costly in terms of silicon surface area so that, in practice, they are used only when making prototypes of integrated circuits but not in the definitive circuits.

SUMMARY

Embodiments of the invention are directed to integrated circuits including a performance test mode that does not have the drawbacks of prior art test methods.

To this end, one embodiment of the invention proposes an integrated circuit which furthermore is compliant with the description of an integrated circuit made in the introduction above wherein each of the configurable cells also includes a propagation input and wherein the integrated circuit also includes a test mode in which the N configurable cells are coupled by their propagation input and their output to the logic blocks and in which the output of the Nth configurable cell (CCN) is coupled to a functional input of the first logic block (BL1) to form an oscillator, i.e., an oscillating looped circuit.

In embodiments of the invention, the cells of the integrated circuit are termed "configurable cells" because they might be configured in a functional mode or in a test mode.

In the functional mode, as in the known circuits, the configurable cells are coupled by their functional input and their output to logic blocks with which they cooperate to form at least one functional circuit. So, in the functional mode, the logic circuit is functionally identical to a prior-art circuit.

In the test mode, on the contrary, the configurable cells are coupled by their propagation input and their output to logic blocks and the output of the Nth configurable cell is coupled to a functional input of the first logic block to form a loop. So, the formed oscillator propagates an oscillation signal whose frequency is representative of the performance (in terms of execution speed) of the logic blocks when the integrated circuit works in the functional mode. The test mode thus enables tests to be made on performance and consumption of various functional blocks. To pass from the functional mode into the test mode, it is enough to make a change in coupling of the configurable cells. This can be done at very little extra cost, especially in terms of silicon surface area. No test circuit is needed.

It should be noted that the expression "functional input" has simply been chosen to recite an input of a configurable cell used, in the functional mode, to couple the configurable cell at a logic block and to form a functional circuit. In the same manner, the expression "propagation input" has simply been chosen to recite an input of the configurable cell used, in the test mode, to couple the configurable cell to a logic block and to form a loop to propagate an oscillating signal. But other expressions may be used, such as "first input" and "second input".

One embodiment of the invention includes simply a means of configuration of the configurable cells that is adapted to the following. In the functional mode, coupling an output of the logic block of rank i included between 1 and N−1, to the functional input of the configurable cell of rank i. In the test mode, coupling an output of the logic block of rank i included between 1 and N−1 to the propagation input of the configurable cell of rank i and coupling one output of the Nth configurable cell to a functional input of the first logic block.

Thus looped, the system of functional blocks and of configurable cells is liable to oscillate.

The configuration means can also be adapted to the application, in the test mode, of a first reference signal to the functional input of the configurable cell of rank i. This makes it possible to impose a signal to be propagated in the oscillator in the test mode.

In one embodiment, the propagation input of the configurable cell of rank i is a clock input of the configurable cell of rank i. In this case, preferably, the configuration means is also adapted to the applying, in the functional mode, of a clock signal to the propagation input of the configurable cell of rank i. Thus, in the functional mode, the circuit obtained has a mode of operation similar to that of the prior-art circuits.

In another embodiment, the propagation input of the configurable cell of rank i is a configurable cell for setting the configurable cell of rank i. In yet another embodiment, the propagation cell of rank i is an input for resetting the configurable cell of rank i. In both these cases, preferably, the configuration means is also adapted to the coupling, in the functional mode, of the propagation input of the configurable cell of rank i to a second source of reference potential. This enables the application of a second reference signal, preferably inactive, to the propagation input of a configurable cell in order to “neutralize” this propagation input.

The configuration means may also include an initiation means to initiate an oscillation in the oscillator during a passage into the test mode. Although the oscillator in the test mode is capable of oscillating alone, the initialization means ensures that an oscillation has actually occurred, and that it has occurred at the very beginning of the test mode. To this end, the initialization means is adapted to applying a start signal pertaining to the start of an oscillation at the propagation input of one of the configurable cells when a test mode beginning signal is received.

The configuration means may also include an initialization means to initialize a configurable cell of rank i as soon as an oscillation has been propagated to a configurable cell of rank i+1. The initialization means may also be adapted to initializing the N configurable cells during a passage into the test mode.

BRIEF DESCRIPTION OF THE DRAWINGS

The invention will be understood more clearly and other features and advantages shall appear more clearly from the following description of an exemplary embodiment of an integrated circuit according to embodiments of the invention. This description is made with reference to the appended drawings, of which.

DETAILED DESCRIPTION

The following discussion is presented to enable a person skilled in the art to make and use the invention. Various modifications to the embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

Figure 1:
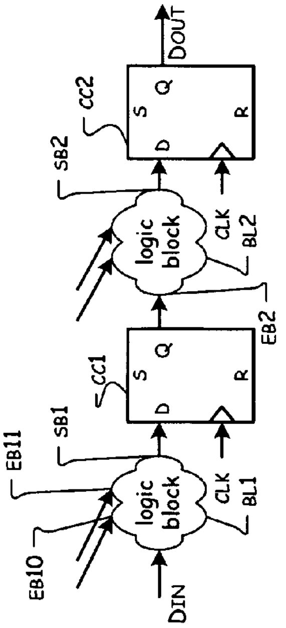
FIG. 1, already described, is a typical diagram of an integrated circuit including at least one functional circuit.
Figure 2:
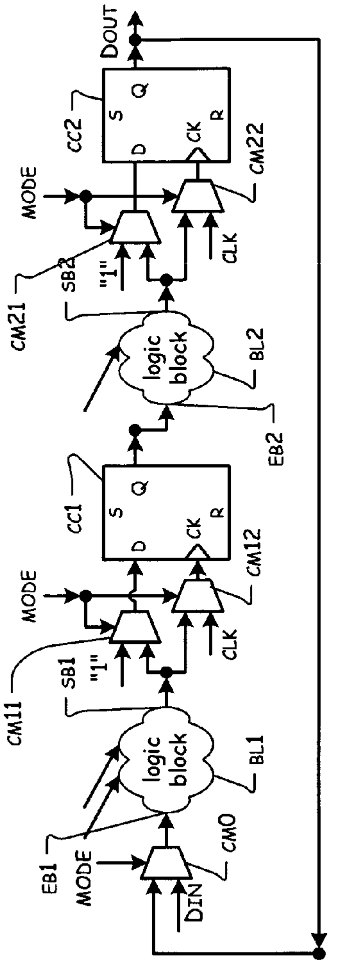
FIG. 2 shows an integrated circuit according to a first embodiment of the invention.

The circuit of FIG. 2 is a first embodiment of the invention including N=2 logic blocks BL1, BL2 and N=2 configurable cells CC1, CC2. The logic blocks BL1, BL2 are, as in the circuit of FIG. 1, logic circuits or portions of logic circuits constituted by combinatorial logic components appropriately associated for the implementation of a particular logic function or a part of a particular logic function. Each logic block includes at least one input EB1, EB2, and one output SB1, SB2, used to associate the logic blocks and the configurable cells. A logic block may also include one or more other control or data inputs EB10, EB11 to receive signals external to the logic block and necessary for the execution of the function implemented by the logic block. In the examples of FIG. 1 or FIG. 2, the N configurable cells CC1, CC2 each include a flip-flop circuit of the D-latch circuit type. Each configurable cell has a functional D input, a propagation input and a Q output. In the example of FIG. 2, the propagation input of a latch circuit CC1, CC2 is a clock input CK of the latch circuit. The propagation input could also be a Set input (input S) of the latch circuit, as shall be seen in the example of FIG. 3, or again a Reset input (input R).

The circuit of FIG. 2 includes a functional mode similar to that of the circuit of FIG. 1, and a test mode, in which the N=2 configurable cells are coupled by their propagation input and their output to the logic blocks and in which the output of the Nth configurable cell is coupled to a functional input of the first logic block to form an oscillator.

To this end, the circuit of FIG. 2 includes a configuration means for the coupling (CMi1), in the functional mode (inactive MODE), of the output of the logic block of rank i included between 1 and N−1 to the functional input of the configurable cell of rank i. To this end, in the example of FIG. 2, the configuration means includes, for each cell CCi of rank i, a first multiplexer CMi1 (CM11, CM21, . . . , or CMN1) including a second data input coupled to the output of the logic block BLi (BL1, BL2, . . . , or BLN), a control input to which the signal MODE is applied and an output coupled to the functional input of the cell CCi.

The configuration means is also adapted to the coupling (CMi2), in the test mode (active MODE), of the output of the logic block of rank i included between 1 and N−1 to the propagation input of the configurable cell of rank i. To this end, in the example of FIG. 2, for each cell CCi of rank i, the configuration means includes a second multiplexer CMi2 (CM12, CM22, . . . , or CMN2) including a first data input coupled to the output of the logic block BLi (BL1, BL2, . . . , or BLN), a control input to which the signal MODE is applied and an output coupled to the propagation input of the cell CCi.

The configuration means is also adapted to the coupling (CM0), in the test mode (active MODE), of the output of the Nth configurable cell (CCN) to a functional input of the first logic block (BL1). To this end, in the example of FIG. 2, the configuration means includes a multiplexer CM0 including a first input to which the signal DIN is applied, a second data input coupled to the output of the Nth cell CCN, a control input to which the signal MODE is applied and an output coupled to the functional input of the first logic block.

The configuration means is also adapted to the application, in the test mode, of a first reference signal (equal to a logic “1” in the example of FIG. 2) to the functional D input of the configurable cell of rank i. To this end, the first multiplexer CMi1 of each cell CCi also includes a first data input coupled to a first source of reference potential.

In the example of FIG. 2, the propagation input of each configurable cell CCi is, in the functional mode, a clock input CK of the configurable cell and the configuration means is also adapted to the application, in the functional mode, of a clock signal CLK to the propagation input of the cell CCi. To this end, the second multiplexer also includes a second data input coupled to a clock signal generator.

In the example of FIG. 2, in the test mode (signal MODE active), the configuration means couples the output of the logic block BL1 of rank i=1 to the propagation input of the configurable cell CC1 of rank i=1, couples the output of the logic block BL2 of rank i=2 to the propagation input of the configurable cell CC2 of rank i=2 and couples the output of the Nth cell CC2 of rank N=2 to the propagation input of the first logic block BL1 of rank 1, the output of the cell CC1 being coupled to the input EB2 of the logic block BL2 and the output of the latch circuit CC2 forming an output DOUT of the oscillator. In the functional mode (inactive MODE), the configuration means couples the output of the logic block BL1 of rank i=1 to the functional input of the configurable cell CC1 of rank i=1, couples the output of the logic block BL2 of rank i=2 to the functional input of the configurable cell CC2 of rank i=2, the DIN input of the integrated circuit being coupled to the input EB1 of the first block BL1, the output of the cell CC1 being coupled to the input EB2 of the block BL2 and the output of the logic block BL2 of rank 2forming the output DOUT of the integrated circuit.

Thus, in the functional mode, the circuit of FIG. 2 is functionally identical to the circuit of FIG. 1. On the contrary, in the test mode, the set of logic blocks BL1, BL2 and of the configurable cells CC1, CC2 forms a feedback-looped system. When it receives a pulse at its propagation input given by the logic block that precedes it, a configurable cell propagates the logic "1" applied to its functional D input at its output. In the same way, when it receives a pulse at its functional input, a logic block propagates it at its output. Thus the set of logic blocks and configurable cells being in a feedback loop, the set oscillates. The oscillation frequency thus obtained is a function of the time needed for the propagation of a pulse through the set of blocks and cells. The oscillation frequency is therefore a measurement of the performance of the integrated circuit in functional mode.

Figure 3:
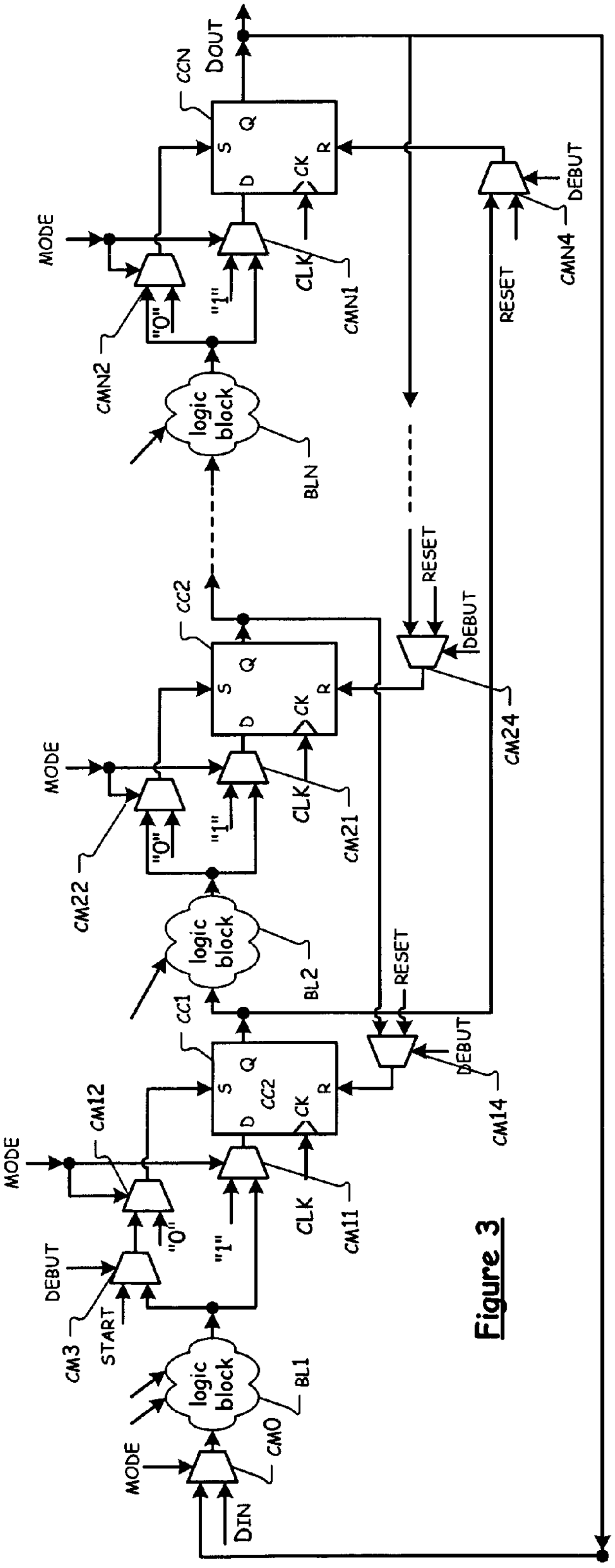
FIG. 3 shows an integrated circuit according to a second embodiment of the invention.

The circuit of FIG. 3 is a second embodiment of the invention, including N logic blocks BL1, BL2, . . . , BLN and N configurable cells CC1, CC2, CCN, coupled through a configuration means similar to that of FIG. 2.

The circuit of FIG. 3 can be distinguished from that of FIG. 2 essentially by the fact that the propagation input of each configurable cell CCi of rank i is a Set input (or S input) of the cell CCi.

The configuration means is adapted accordingly: for every i between 1 and N, the output of the second multiplexer CMi2 of each cell CCi is coupled to the Set input of the cell CCi, and a second reference signal (equal to a logic "0" in the example of FIG. 3) is applied to the second data input of the second multiplexer CMi2. The configuration means is adapted so that in the functional mode, it applies the second reference signal, an inactive constant signal, to the Set input of the cell. In the test mode, it couples the output of the functional block of rank i to the Set input of the cell CCi.

The circuit of FIG. 3 also presents several other improvements relative to the circuit of FIG. 2.

The configuration means also includes (FIG. 3) an initiation means to initiate an oscillation in the oscillator during a passage into the test mode. The initiation means is adapted to applying a signal START for the start of an oscillation to the propagation input of one of the configurable cells when a signal DEBUT for beginning the test mode is received. To this end, the initiation means includes a third multiplexer CM3, including a first data input to which the signal START is applied, a second data input coupled to the data output of a logic block of rank i (in the example of FIG. 3 the block BL1), an output coupled to the first data input of the first multiplexer CMi1 associated with one of the configurable cells CCi (in the example of FIG. 3, the first cell CC1) and a control input to which the signal MODE is applied.

The signal DEBUT is a pulsed signal, active during a brief instant at the time of the passage from the functional mode to the test mode (i.e., when the signal MODE goes from the inactive state to the active state). The signal MODE for its part remains active throughout the duration of the test.

Thus, at the time of the passage into the test mode, a pulse of the signal DEBUT enables application of the signal START to the propagation input of the cell CC1 and then, throughout the duration of the test mode, the propagation input of the cell CC1 is coupled to the output of the block BL1 by means of the multiplexers CM3 and CMi2.

It must be noted that, in the example of FIG. 3, the third multiplexer CM3 was coupled between the first functional block and the second multiplexer CM12 associated with the configurable cell CC1. The pulse START initiating the oscillation is thus applied to the first cell CCi. However, the third multiplexer could equally well be coupled between any functional block BLi of rank i and the second multiplexer CMi2 associated with the cell CCi of same rank i, for an identical function (initiating an oscillation).

The configuration means of FIG. 3 also includes a means of initialization to initialize (i.e., give an initial value, for example equal to 0 in the example of FIG. 3) a configurable cell of rank i as soon as an oscillation has been propagated to a configurable cell of rank i+1. The initialization means is also adapted to initializing the N configurable cells during a passage into the test mode. To this end, the initiation means includes, for each cell CCi of rank i, a fourth multiplexer CMi4 (CM14, CM24, . . . , CMN4) including a first data input to which a reset signal RESET is applied, a second data input coupled to the output of the cell $CC_{i+1}$ of rank i+1, an output coupled to an initialization input (in the example of FIG. 3, a Reset input RESET or R input of the configurable cell CCi of rank i, and a control input to which the signal DEBUT is applied.

Thus, at the time of the passage into the test mode, a pulse of the signal DEBUT enables application of the signal RESET to the initialization input of the cell CCi. Then, throughout the duration of the test mode, the initialization input of the cell CCi is coupled to the output of the cell $CC_{i+1}$ by means of the multiplexer CMi4.

Integrated circuits including embodiments of the present invention can be contained in a variety of different types of electronic systems, such as computer systems, embedded systems, and so on.

From the foregoing it will be appreciated that, although specific embodiments of the invention have been described herein for purposes of illustration, various modifications may be made without deviating from the spirit and scope of the invention.

What is claimed is:

1. An integrated circuit comprising N configurable cells each comprising one functional input, one propagation input and one output, the circuit comprising a functional mode in which the N configurable cells are coupled by their respective functional input to a single logic block input and their respective output to a single logic block output with which they cooperate to form at least one functional circuit, wherein the integrated circuit also comprises a test mode in which the N configurable cells are coupled by their respective propagation input to a single logic block input and their respective output to a single logic block output and in which the output of the Nth configurable cell is coupled to a functional input of the first logic block to form an oscillator.

2. An integrated circuit comprising N configurable cells each comprising one functional input, one propagation input and one output, the circuit comprising a functional mode in which the N configurable cells are coupled by their functional input and their output logic blocks with which they cooperate to form at least one functional circuit, wherein the integrated circuit also comprises a test mode in which the N configurable cells are coupled by their propagation input and their output logic blocks and in which the output of the Nth configurable cell is coupled to a functional input of the first logic block to form an oscillator; and further comprising a configuration means to perform the following:

in functional mode, coupling the output of the logic block of rank i included between 1 and N−1, to the functional input of the configurable cell of rank i, and in test mode, coupling the output of the logic block of rank i included between 1 and N−1 to the propagation input of the configurable cell of rank i and coupling the output of the Nth configurable cell to a functional input of the first logic block.

3. The integrated circuit according to claim 2 wherein the configuration means is also adapted to the application, in test mode, of a first reference signal to the functional input of the configurable cell of rank i.

4. The integrated circuit according to claim 2, wherein the propagation input is a clock input of the configurable cell of rank i and wherein the configuration means is also adapted to the applying, in functional mode, of a clock signal to the propagation input of the configurable cell of rank i.

5. The integrated circuit according to claim 2, wherein the propagation input is an input for setting the configurable cell of rank i and wherein the configuration means is also adapted to the coupling, in functional mode, of the propagation input of the latch circuit to a second source of reference potential.

6. The integrated circuit according to claim 2, wherein the configuration means also comprises an initiation means to initiate an oscillation in the oscillator during a passage into test mode.

7. The integrated circuit according to claim 6, wherein the initialization means is adapted to applying a start signal pertaining to the start of an oscillation at the propagation input of one of the configurable cells when a test mode beginning signal is received.

8. The integrated circuit according to claim 2, wherein the configuration means also comprises an initialization means to initialize a configurable cell of rank i as soon as an oscillation has been propagated to a configurable cell of rank i+1.

9. The integrated circuit according to claim 8, wherein the initialization means is also adapted to initializing the N configurable cells during a passage into test mode.

10. An integrated circuit, comprising:

a plurality of logic blocks, each logic block having an input and an output;

a plurality of configurable cells, each configurable cell including a functional input, a propagation input, and an output; and a configuration circuit coupled to the logic blocks and to the configurable cells, the configuration circuit operable during a functional mode of operation to couple the logic blocks and configurable cells in series between an input node and an output node, each configurable cell being coupled between two corresponding logic blocks so that the configurable cell receives the output from a first one of the two logic blocks on the functional input of the cell, a first signal on the propagation input, and so that the cell provides the output from cell to the input of the other one of the two logic blocks, with a first one of the series-connected logic blocks having its input coupled to an input node and a last one of the series-connected logic blocks having its output connected to an output node;

the configuration circuit operable during a test mode of operation to couple the logic blocks and configurable cells in series between the input node and the output node, each configurable cell being coupled between two corresponding logic blocks so that the configurable cell receives the output from a first one of the two logic blocks on the propagation input of the cell, a second signal on the functional input, and so that the cell provides the output from cell to the input of the other one of the two logic blocks, and wherein the output node is coupled via the input node to the input of the first one of the series-connected logic blocks.

11. The integrated circuit of claim 10, wherein each of the configurable cells comprises a D-type latch circuit and a D-input of each D-type latch circuit corresponds to the functional input and a clock input corresponds to the propagation input of each latch circuit.

12. The integrated circuit of claim 11, wherein the first signal applied to the propagation input of each D-type latch circuit during the functional mode of operation comprises a clock signal; and wherein the second signal applied to the functional input of each D-type latch circuit during the test mode of operation comprises a first reference signal.

13. The integrated circuit of claim 10, wherein each of the configurable cells comprises a D-type latch circuit and a D-input of each D-type latch circuit corresponds to the functional input and a set input corresponds to the propagation input of each latch circuit.

14. The integrated circuit of claim 13, wherein the first signal applied to the propagation input of each D-type latch circuit during the functional mode of operation comprises a second reference signal; and wherein the second signal applied to the functional input of each D-type latch circuit during the test mode of operation comprises a first reference signal.

15. The integrated circuit of claim 14 wherein the configuration circuit further comprises an initialization circuit operable to initialize the configurable cells to provide predetermined values at the start of the test mode of operation.

16. The integrated circuit of claim 15 wherein the initialization circuit is operable to apply a start signal at the propagation input of one of the configurable cells responsive to a mode signal going active to indicate the start of the test mode of operation.

17. The integrated circuit of claim 16 wherein the initialization circuit is further operable to initialize the configurable cell of rank i as soon as a signal has propagated through a logic block of rank i+1 and to the configurable cell of rank i+1.

18. An electronic system, comprising:

electronic circuitry;

an integrated circuit coupled to the electronic circuitry, the integrated circuit comprising:

a plurality of logic blocks, each logic block having an input and an output;

a plurality of configurable cells, each configurable cell including a functional input, a propagation input, and an output; and a configuration circuit coupled to the logic blocks and to the configurable cells, the configuration circuit operable during a functional mode of operation to couple the logic blocks and configurable cells in series between an input node and an output node, each configurable cell being coupled between two corresponding logic blocks so that the configurable cell receives the output from a first one of the two logic blocks on the functional input of the cell, a first signal on the propagation input, and so that the cell provides the output from cell to the input of the other one of the two logic blocks, with a first one of the series-connected logic blocks having its input coupled to an input node and a last one of the series-connected logic blocks having its output connected to an output node;

the configuration circuit operable during a test mode of operation to couple the logic blocks and configurable cells in series between the input node and the output node, each configurable cell being coupled between two corresponding logic blocks so that the configurable cell receives the output from a first one of the two logic blocks on the propagation input of the cell, a second signal on the functional input, and so that the cell provides the output from cell to the input of the other one of the two logic blocks, and wherein the output node is coupled via the input node to the input of the first one of the series-connected logic blocks.

19. The electronic system of claim 16 wherein the electronic circuitry comprises computer circuitry.

* * * * *